US008985875B2

(12) United States Patent
Kato et al.

(10) Patent No.: US 8,985,875 B2
(45) Date of Patent: Mar. 24, 2015

(54) OPTICAL CONNECTOR HAVING RESIN MEMBER INCLUDING LENS

(75) Inventors: Kiyoshi Kato, Yokohama (JP); Tomomi Sano, Yokohama (JP); Yuji Nakura, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/995,657

(22) PCT Filed: Dec. 1, 2011

(86) PCT No.: PCT/JP2011/077764
§ 371 (c)(1),
(2), (4) Date: Jun. 19, 2013

(87) PCT Pub. No.: WO2012/086384
PCT Pub. Date: Jun. 28, 2012

(65) Prior Publication Data
US 2013/0266278 A1  Oct. 10, 2013

(30) Foreign Application Priority Data

Dec. 24, 2010  (JP) .................... 2010-288334

(51) Int. Cl.
*G02B 6/42* (2006.01)
*G02B 6/38* (2006.01)
(Continued)

(52) U.S. Cl.
CPC .............. *G02B 6/42* (2013.01); *G02B 6/3897* (2013.01); *G02B 6/4246* (2013.01);
(Continued)

(58) Field of Classification Search
CPC ................................ G02B 6/42; G02B 6/4292
USPC ........................................... 385/61, 79, 92–94
See application file for complete search history.

(56) References Cited

U.S. PATENT DOCUMENTS 5,307,435 A * 4/1994 Chihara .......................... 385/92
5,526,455 A * 6/1996 Akita et al. ..................... 385/93
(Continued)

FOREIGN PATENT DOCUMENTS

JP  A-7-294777  11/1995
JP  A-9-292549  11/1997
(Continued)

OTHER PUBLICATIONS

International Search Report issued in International Patent Application No. PCT/JP2011/077764 dated Feb. 7, 2012.
(Continued)

*Primary Examiner* — Charlie Y Peng
(74) *Attorney, Agent, or Firm* — Oliff PLC

(57) ABSTRACT

An optical connector includes a housing, a photoelectric conversion circuit board on which a photoelectric conversion element is mounted, and a resin member made of a light transmissive synthetic resin and arranged on a plate surface of the photoelectric conversion circuit board so as to cover the photoelectric conversion element. The photoelectric conversion circuit board is housed in the housing. The resin member includes a sleeve to which a ferrule attached to an end of an optical fiber is fitted. The sleeve of the resin member is arranged such that an axial direction thereof is substantially perpendicular to the plate surface of the photoelectric circuit board. The resin member integrally includes a lens on an axial line of the sleeve such that the lens faces the photoelectric conversion element.

4 Claims, 20 Drawing Sheets

(51) Int. Cl.
*H01S 5/022* (2006.01)
*H01S 5/183* (2006.01)

(52) U.S. Cl.
CPC ........... *G02B 6/4265* (2013.01); *G02B 6/4281* (2013.01); *G02B 6/4284* (2013.01); *G02B 6/4292* (2013.01); *H01S 5/02208* (2013.01); *H01S 5/02236* (2013.01); *H01S 5/183* (2013.01)
USPC ......................................................... 385/93

(56) References Cited

U.S. PATENT DOCUMENTS

| | | | |
|---|---|---|---|
| 5,784,513 | A | 7/1998 | Kuribayashi et al. |
| 6,086,265 | A | 7/2000 | Kuribayashi et al. |
| 6,206,582 | B1* | 3/2001 | Gilliland ........................ 385/92 |
| 6,517,258 | B1 | 2/2003 | Keska et al. |
| 6,554,494 | B2 | 4/2003 | Bruland et al. |
| 7,070,339 | B2 | 7/2006 | Nagasaka et al. |
| 7,104,703 | B2 | 9/2006 | Nagasaka et al. |
| 7,130,194 | B2* | 10/2006 | Togami et al. ................ 361/715 |
| 7,156,563 | B2* | 1/2007 | Morioka ......................... 385/93 |
| 7,160,039 | B2* | 1/2007 | Hargis et al. ................... 385/93 |
| 7,348,540 | B2 | 3/2008 | Mogi et al. |
| 2001/0017965 | A1 | 8/2001 | Bruland et al. |
| 2002/0191910 | A1* | 12/2002 | Gallup et al. .................. 385/33 |
| 2004/0022487 | A1 | 2/2004 | Nagasaka et al. |
| 2004/0028349 | A1 | 2/2004 | Nagasaka et al. |
| 2004/0086240 | A1 | 5/2004 | Togami et al. |
| 2004/0252951 | A1 | 12/2004 | Nagasaka et al. |
| 2004/0264883 | A1* | 12/2004 | Althaus et al. ................. 385/88 |
| 2005/0018977 | A1* | 1/2005 | Beer et al. ..................... 385/88 |
| 2006/0022213 | A1* | 2/2006 | Posamentier .................. 257/99 |
| 2007/0131856 | A1 | 6/2007 | Mogi et al. |
| 2011/0091168 | A1* | 4/2011 | Steijer et al. ................... 385/88 |

FOREIGN PATENT DOCUMENTS

| | | |
|---|---|---|
| JP | A-2001-36100 | 2/2001 |
| JP | A-2001-272583 | 10/2001 |
| JP | A-2004-86137 | 3/2004 |
| JP | A-2004-272061 | 9/2004 |
| JP | A-2006-041234 | 2/2006 |
| JP | A-2007-043073 | 2/2007 |
| JP | A-2007-171427 | 7/2007 |
| JP | A-2007-183565 | 7/2007 |

OTHER PUBLICATIONS

Written Opinion issued in International Patent Application No. PCT/JP2011/077764 dated Feb. 7, 2012 (with translation).

Mar. 11, 2014 Office Action issued in Japanese Application No. 2010-288334 (with translation).

Oct. 31, 2013 Japanese Office Action issued in Japanese Application No. 2010-288334 (with translation).

* cited by examiner

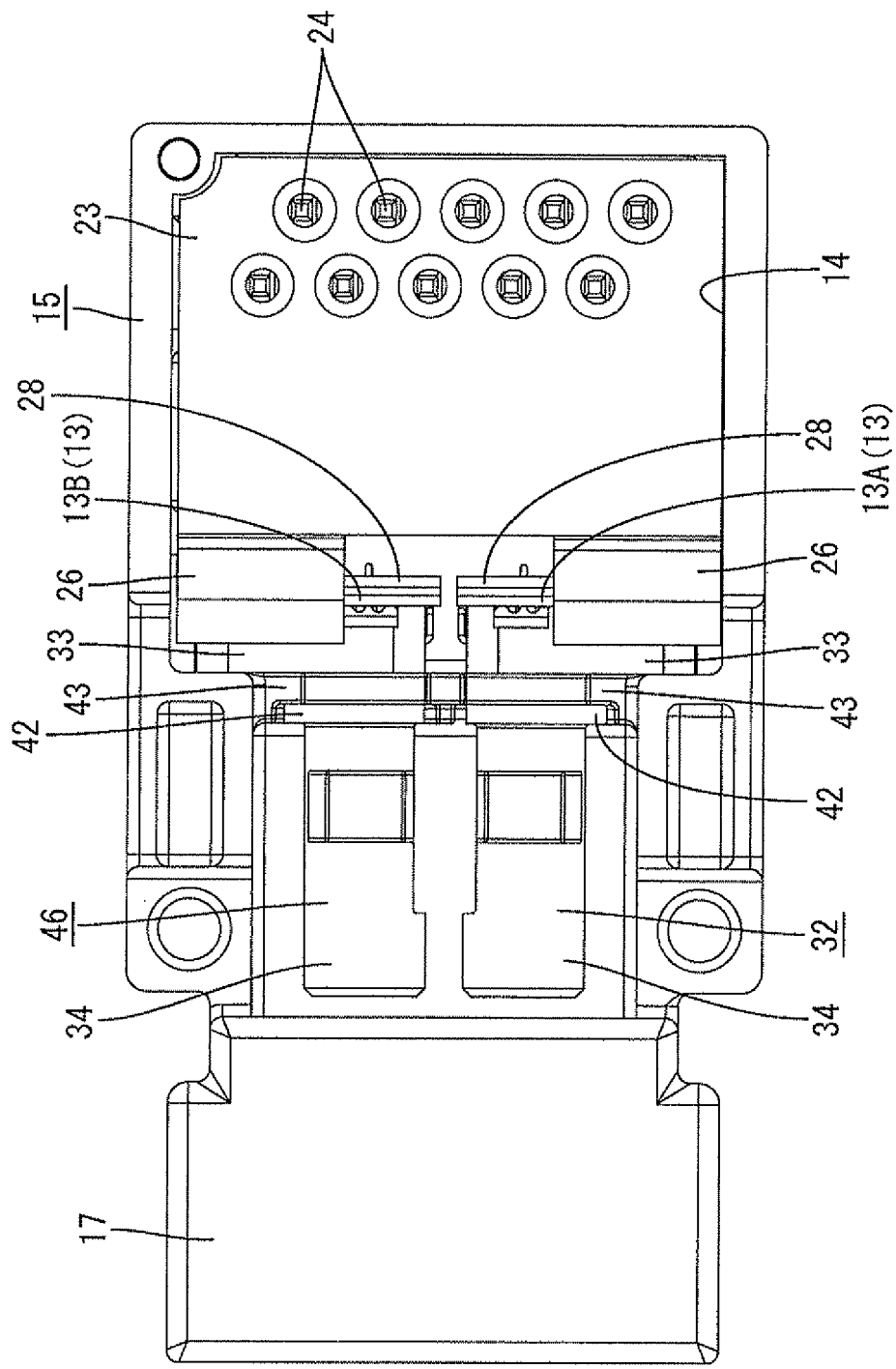

US 8,985,875 B2

OPTICAL CONNECTOR HAVING RESIN MEMBER INCLUDING LENS

TECHNICAL FIELD

The present invention relates to an optical connector.

BACKGROUND ART

An optical connector described in Patent Document 1 is known as an optical connector configured to optically connect an optical fiber and a photoelectric conversion element. The optical connector includes a housing and an optical module housed in the housing.

The optical module is made of light transmissive synthetic resin and includes a resin member (a holder) to which a ferrule attached to an end of the optical fiber is attached. The resin member includes a tubular sleeve into which the ferrule is fitted. Further, a photoelectric conversion element is provided on a photoelectric element attachment portion of the resin member. The resin member integrally includes a lens on an optical path extending between the optical fiber and the photoelectric conversion element.

The photoelectric conversion element is attached to the photoelectric element attachment portion so as to be positioned on a line perpendicular to an axial direction of the sleeve. This requires the resin member to include a light reflection means for reflecting the light from the optical fiber to the photoelectric conversion element or reflecting the light from the photoelectric conversion element to the optical fiber. The light from the optical fiber travels in the resin member along the axial direction of the sleeve and is reflected by the light reflection means. Then, the light travels in a direction perpendicular to the axial direction of the sleeve and reaches the photoelectric element. On the other hand, the light from the photoelectric conversion element reaches the optical fiber in a reversed route.

Patent Document 1: Japanese Unexamined Patent Publication No. 2007-171427

In the above-described configuration, however, the light from the optical fiber travels in the resin member along the axial direction of the sleeve and is reflected by the light reflection means. Then, the light further travels in the resin member in the direction perpendicular to the axial direction of the sleeve. Accordingly, the optical path length of the light passing through the resin member is relatively long. Similarly, when the light from the photoelectric conversion element travels in the resin member and reaches the optical fiber, the optical path length is relatively long.

In this configuration, if a force is applied to the optical fiber in a direction perpendicular to the axial line of the optical fiber, the force is transmitted to the resin member and a shape of the resin member is changed. Accordingly, the light passing through the resin member may be attenuated and the light may not reach the photoelectric conversion element or the optical fiber. Such problems may be particularly relevant in the above-described conventional technology, because the optical path length of the light passing through the resin member is relatively long as described above.

Therefore, there is a need in the art to provide an optical connector in which optical output is less likely to be reduced even when the force is applied to the optical fiber in the direction perpendicular to the axial line of the optical fiber.

SUMMARY

An optical connector according to the present invention includes a housing, a photoelectric conversion circuit board on which a photoelectric conversion element is mounted, and a resin member made of a light transmissive synthetic resin and arranged on a plate surface of the photoelectric conversion circuit board so as to cover the photoelectric conversion element. The photoelectric conversion circuit board is housed in the housing. The resin member includes a sleeve to which a ferrule attached to an end of an optical fiber is fitted. The sleeve of the resin member is arranged such that an axial direction thereof is substantially perpendicular to the plate surface of the photoelectric circuit board. The resin member integrally includes a lens on an axial line of the sleeve such that the lens faces the photoelectric conversion element.

According to the present embodiment, the optical output from the optical fiber fitted in the sleeve travels in the resin member along the axial direction of the sleeve, and the optical output is focused by the lens and outputted from the lens. The optical output from the lens is applied to the photoelectric conversion element arranged to face the lens. On the other hand, the optical output from the photoelectric conversion element reaches the lens arranged to face the photoelectric conversion element, and the optical output is focused by the lens and travels in the resin member along the axial direction of the sleeve to the optical fiber fitted in the sleeve. As described above, according to the present invention, the optical path length in the resin member can be relatively short, because the light travels in the resin member on the axial line of the sleeve. Accordingly, the optical output passing through the resin member is less likely to be reduced even if a force is applied to the optical fiber in the direction perpendicular to the axial line of the optical fiber.

As described above, according to the present invention, the optical output is less likely to be reduced even if a force is applied to the optical fiber in the direction perpendicular to the axial direction of the optical fiber.

BRIEF DESCRIPTION OF THE DRAWINGS

FIG. 20 is a plan view of the housing body in which the photoelectric conversion circuit board and the inner board are housed.

EXPLANATION OF SYMBOLS

Figure 1:
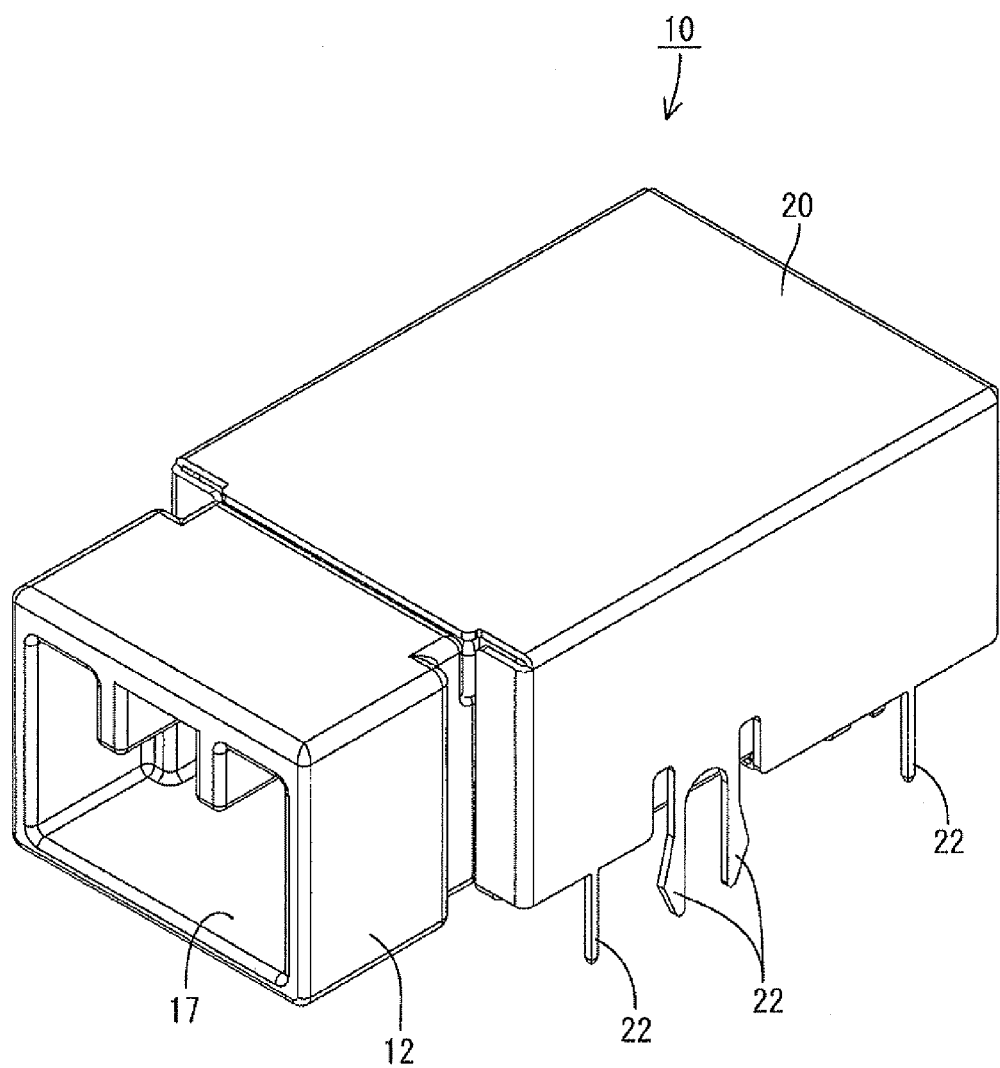
FIG. 1 is an overall perspective view of an optical connector according to an embodiment of the present invention.

10: Optical connector
11: Outer board
12: Housing
13: Photoelectric conversion circuit board
13A: Light receiving circuit board (photoelectric conversion circuit board)
13B: Light emitting circuit board (photoelectric conversion circuit board)
15: Housing body (Housing)
16: Cap (Housing)
18: Optical fiber
19: Ferrule
23: Inner board
24: Terminal connector
26: Flexible board (relay member)
27: Photoelectric conversion element
27A: Light receiving element (photoelectric conversion element)
27B: Light emitting element (photoelectric conversion element)
30: Shielding layer
32: Light receiving resin member (resin member)
33: Base (engagement portion)
34: Sleeve
35: Inner shield
39: Lens
40: Window
42: Engagement rib (engagement portion)
43: First sleeve holding rib (engagement portion receiving portion)
44: Second sleeve holding rib (engagement portion receiving portion)
46: Light emitting resin member (resin member)

BEST MODE FOR CARRYING OUT THE INVENTION

<First Embodiment>

An embodiment of the present invention will be described with reference to FIG. 1 to FIG. 20. An optical connector 10 according to the present embodiment is attached to an outer board 11 including a conductive path (not illustrated) formed by printed wiring technology. The optical connector 10 includes a housing 12 made of synthetic resin and a photoelectric conversion circuit board 13 housed in the housing 12. An upper side and a lower side referred in the following description correspond to an upper side and a lower side in FIG. 4, respectively. In addition, a front side and a rear side correspond to a left side and a right side in FIG. 4, respectively.

(Housing 12)

Figure 4:
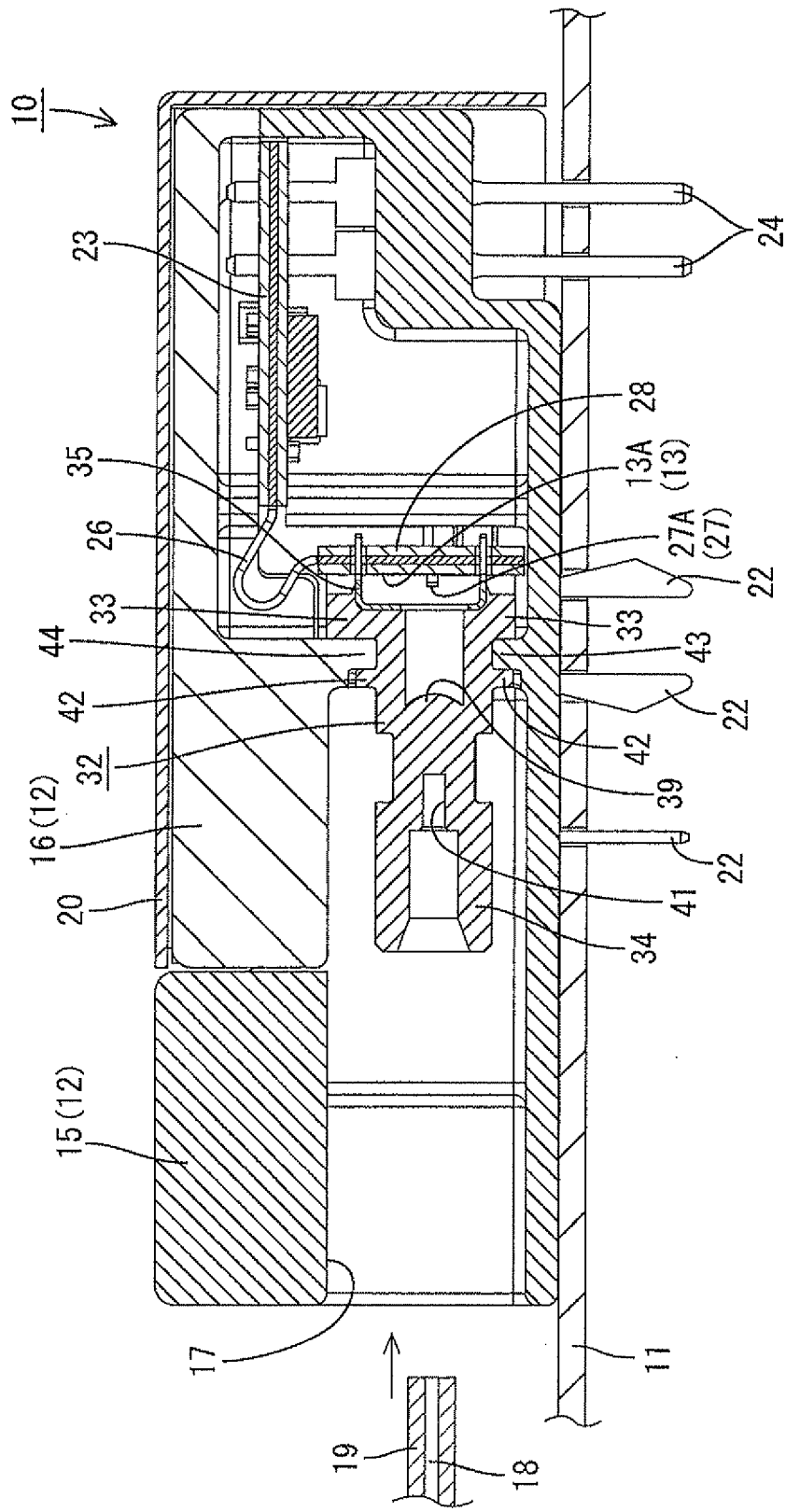
FIG. 4 is a cross-sectional view of the optical connector taken along a plane extending along the optical axis of the resin member.

As illustrated in FIG. 4, the housing 12 includes a housing body 15 and a cap 16. The housing body 15 has an opening 14 at its upper side and the cap 16 is fitted to the housing body 15 to close the opening 14. The housing body 15 includes a hood 17 opening to a front side (the left side in FIG. 4). To the hood 17, a connector (not illustrated) is fitted from the front side. The connector includes an optical fiber 18 onto which a ferule 19 is fitted at an end portion of the optical fiber 18.

Figure 2:
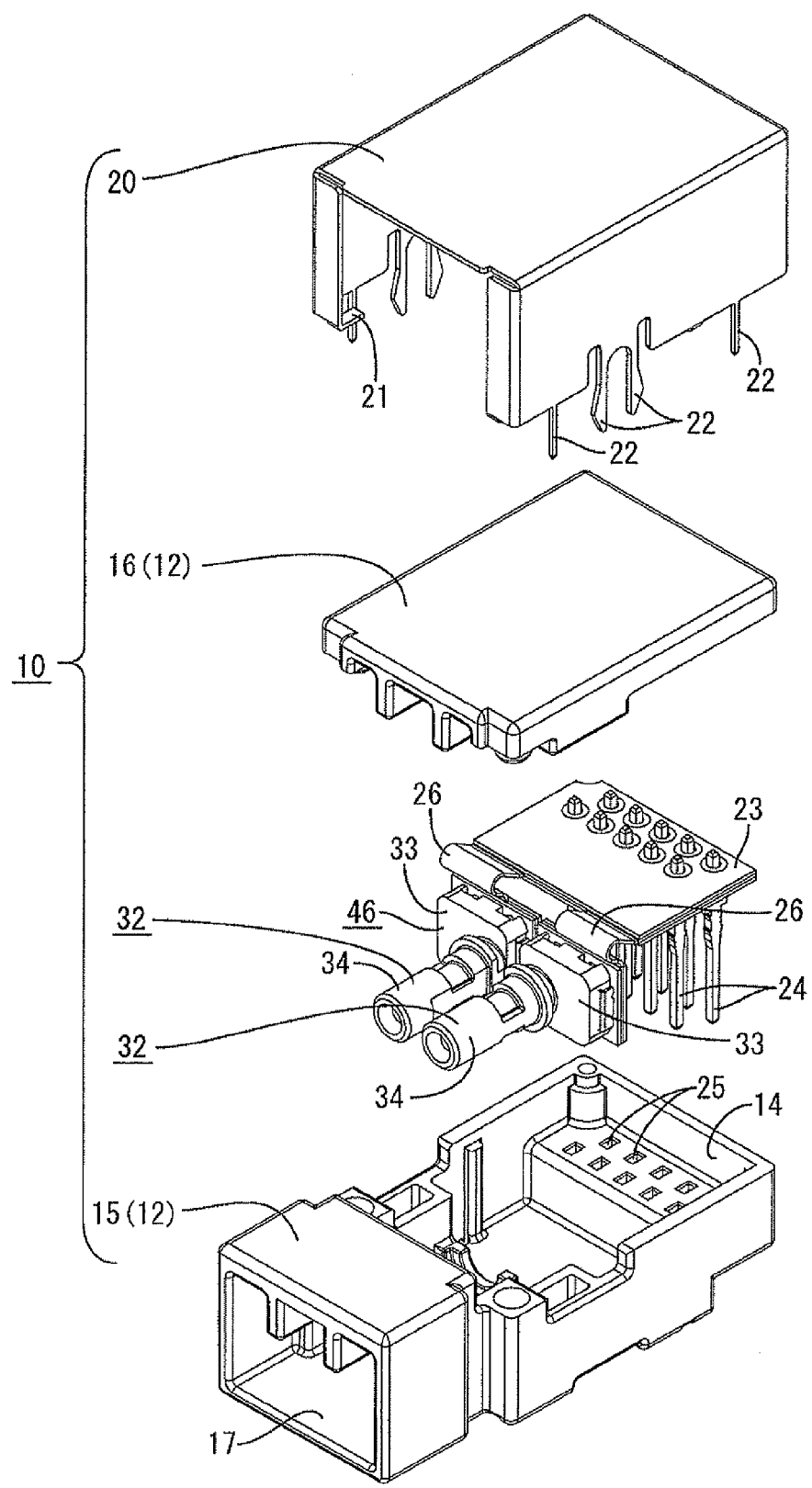
FIG. 2 is an exploded perspective view of the optical connector.
Figure 3:
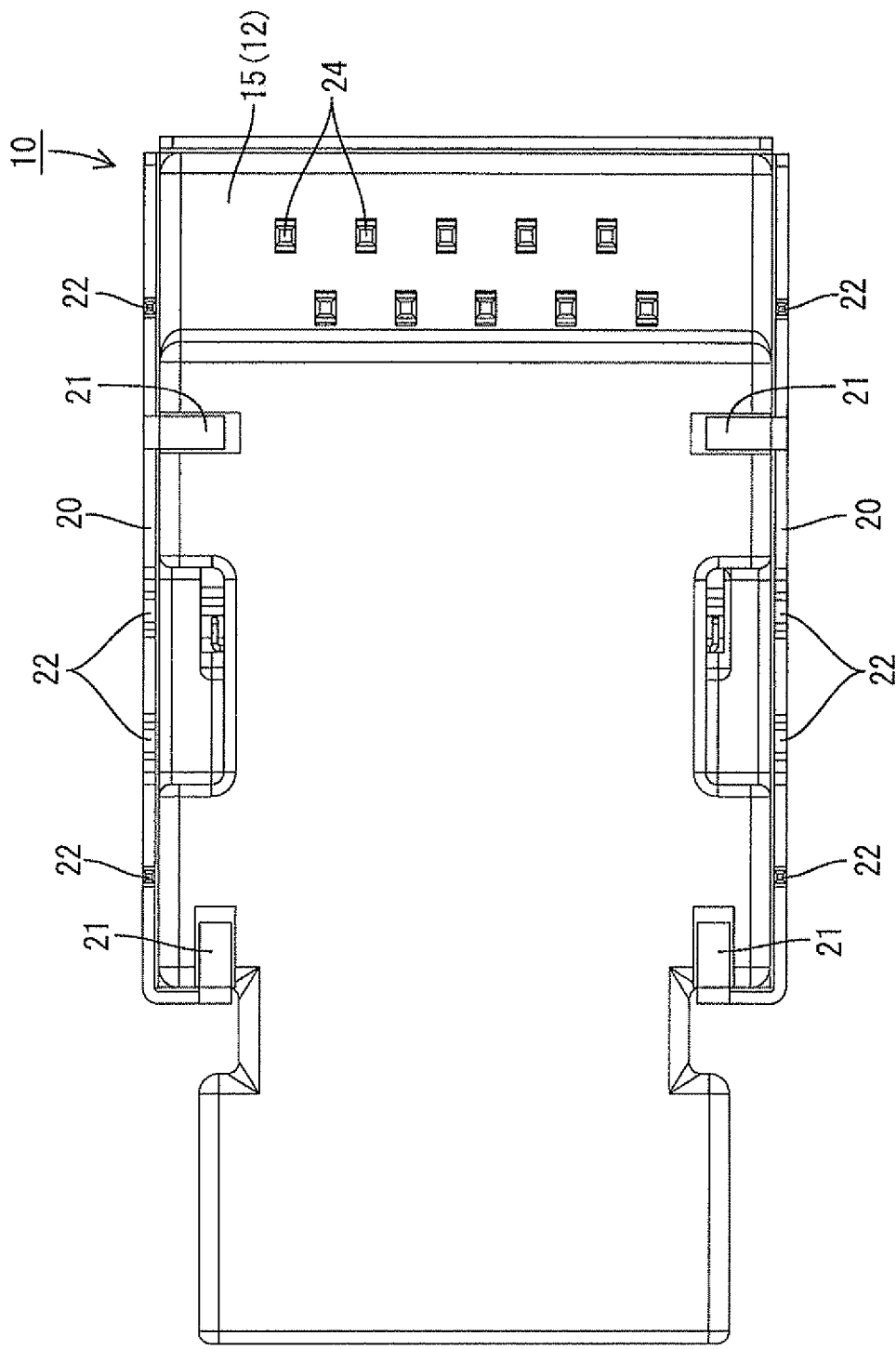
FIG. 3 is a bottom view of the optical connector.

As illustrated in FIG. 1 and FIG. 2, an outer shield 20 is fitted onto the housing 12 except for an area corresponding to the hood 17. The outer shield 20 is obtained by pressing a metal plate into a predetermined shape. The outer shield 20 opens to the front side and the lower side. The outer shield 20 electromagnetically shields the housing 12 except for a front surface and a lower surface of the housing 12. As illustrated in FIG. 3, the outer shield 20 includes locking tabs 21 that protrude from a lower edge thereof. The locking tabs 21 are bent along the lower surface of the housing 12, whereby the outer shield 20 and the housing 12 are fitted together. Further, the outer shield 20 includes a plurality of connection legs 22 that protrude downwardly from the lower edge of the outer shield 20. The connection legs 22 extend through the outer board 11 and are connected to the electrically conductive paths of the outer board 11 by a known method such as a soldering.

(Inner Board 23)

As illustrated in FIG. 4, the housing body 15 houses an inner board 23. In the present embodiment, the inner board 23 includes a flexible board 26 (Flexible Printed Circuit Board) and circuit boards each arranged on each of an upper surface and a lower surface of the flexible board 26. The circuit boards each include insulating substrates that include a conductive path on a surface thereof by printed wiring technology. Although not illustrated in detail, the circuit board according to the present embodiment includes four insulating substrates. On an upper surface of the circuit board that is arranged on the upper surface of the flexible board 26 and on a lower surface of the circuit board that is arranged on the lower surface of the flexible board 26, an electronic component is mounted.

Figure 5:
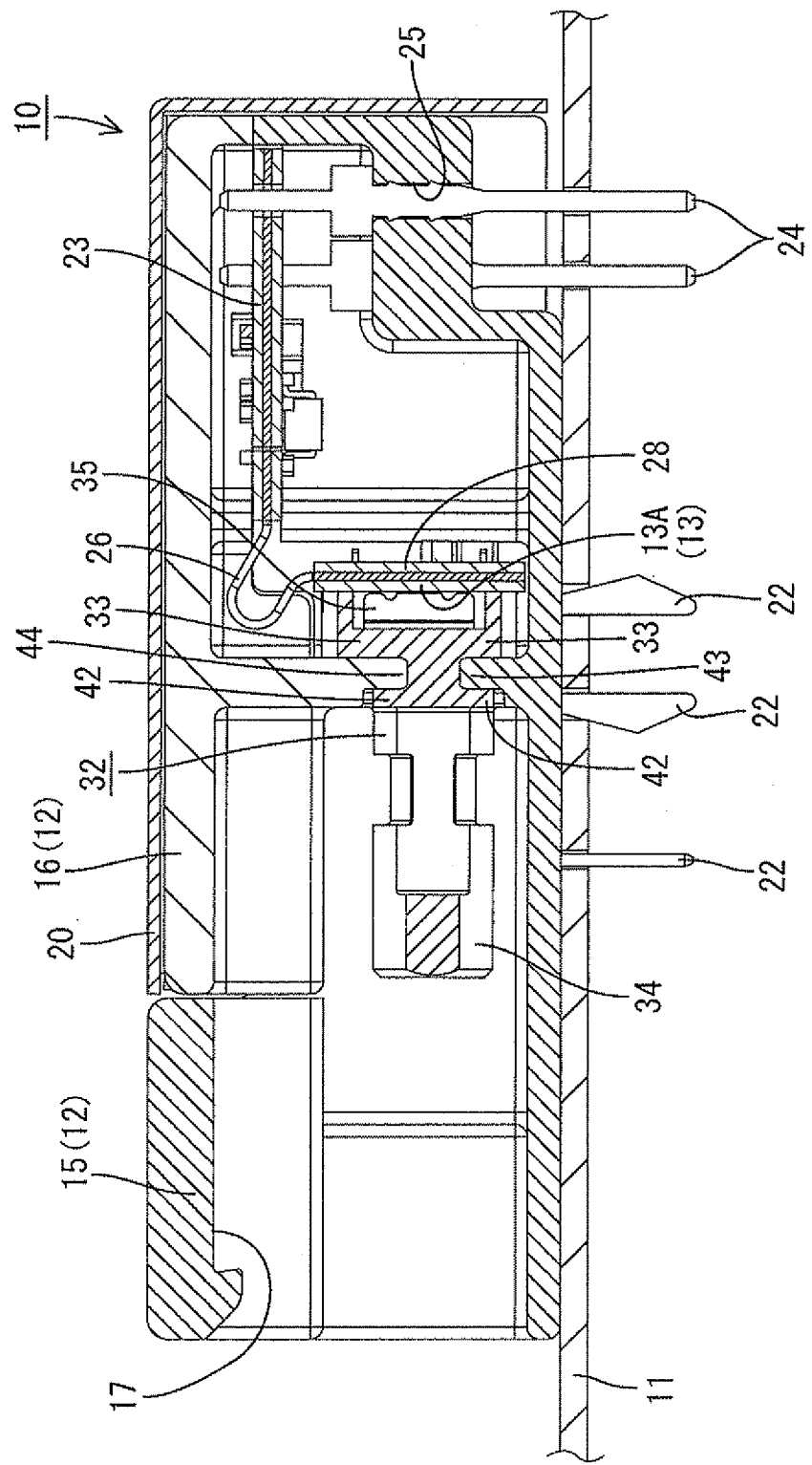
FIG. 5 is a cross-sectional view of the optical connector in which a terminal connector is press fitted in a housing body.

As illustrated in FIG. 5, an end portion of each terminal connector 24 having a bar-like shape is passed through the inner board 23 and connected to the conductive paths formed on the inner board 23 at a position closer to a rear end of the inner board 23. The other end portion of each terminal connector 24 is press fitted in respective terminal insertion holes 25 formed in the bottom wall of the housing body 15 and protrude downwardly from the bottom wall of the housing body 15. The other end of each terminal connector 24 is passed through the outer board 11 and connected to the conductive path formed on the outer board 11 by a known method such as a soldering.

(Flexible Board 26)

Figure 6:
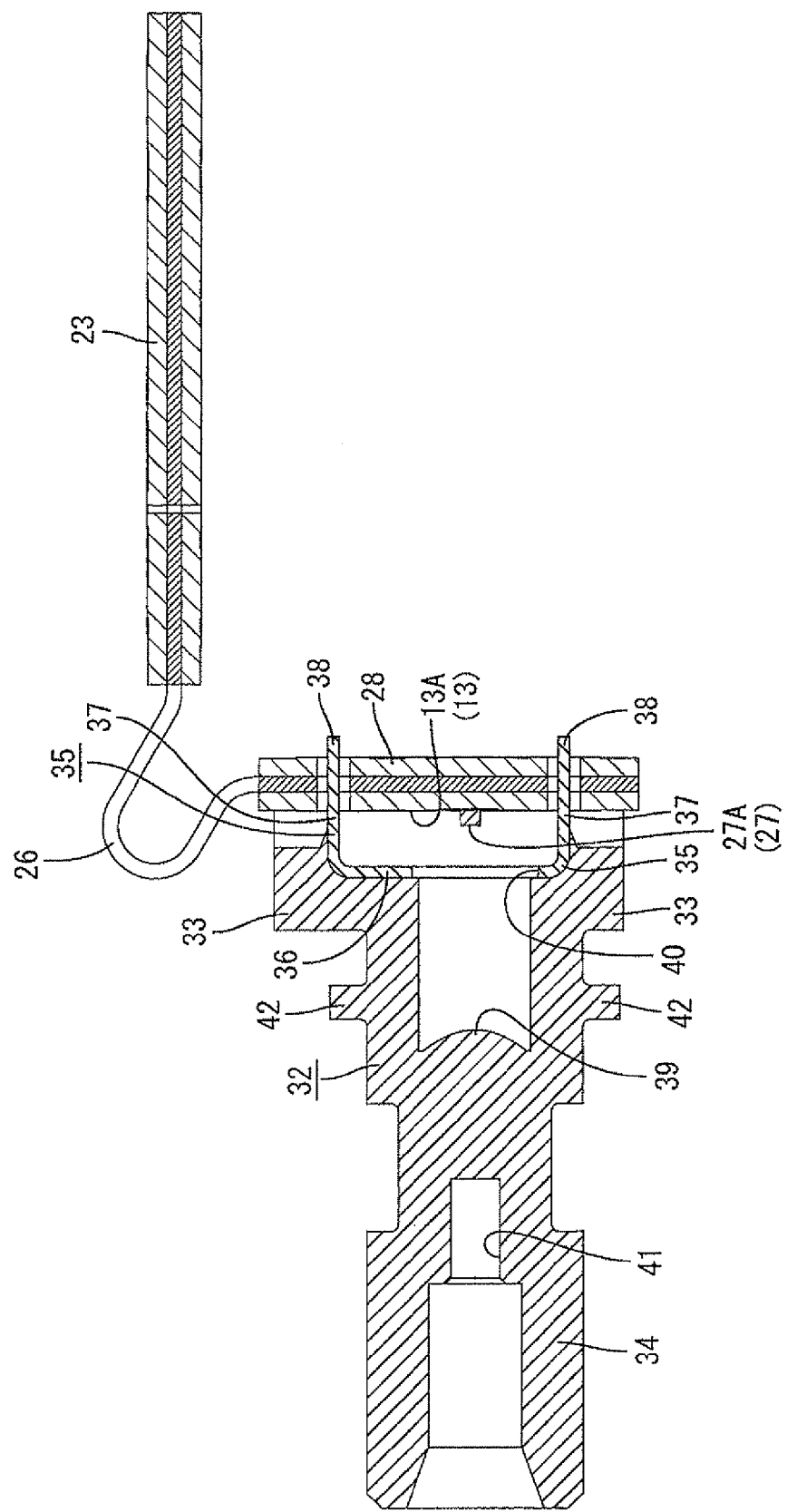
FIG. 6 is a magnified cross-sectional view of a main part of a connection structure between a photoelectric conversion circuit board and an inner board.

As illustrated in FIG. 2 and FIG. 6, the flexible board 26 includes two divided sections each protruding frontward from a front edge of the inner board 23. As illustrated in FIG. 6, each divided section of the flexible board 26 is bent downwardly at substantially a right angle. On a front surface of each divided section of the flexible board 26 that is bent downwardly, the photoelectric conversion circuit board 13 on which a photoelectric conversion element 27 is mounted is arranged. In this way, the flexible board 26 is configured as a relay member that electrically connects the inner board 23 and the photoelectric conversion circuit board 13. Further, on a rear surface of each divided section of the flexible board 26 that is bent downwardly, a sub board 28 is arranged. Although not illustrated in detail, an electronic component is mounted on a rear surface of each sub board 28.

Figure 7:
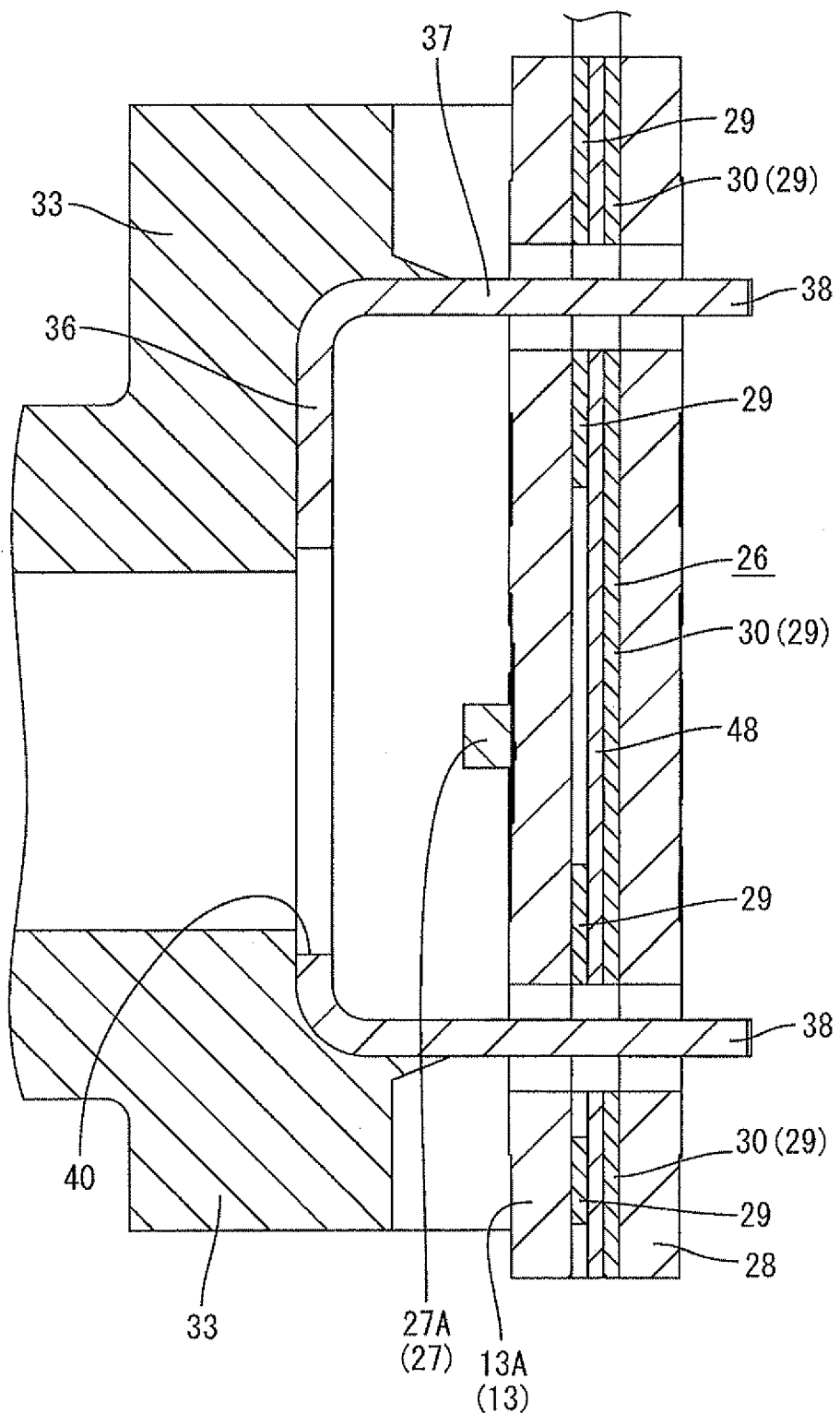
FIG. 7 is a magnified cross-sectional view of a main part of a flexible board.

As illustrated in FIG. 7, the photoelectric conversion element 27 is mounted on a front surface of the above-described photoelectric conversion circuit board 13. The flexible board 26 is arranged to cover the entire rear surface (a surface opposite to the surface on which the photoelectric conversion element 27 is mounted) of the photoelectric conversion circuit board 13. The flexible board 26 includes two layers of electrically conductive paths 29, 29 and an insulating film 48 arranged to insulate the electrically conductive paths 29, 29. One of the electrically conductive path 29 is a shielding layer 30 that is arranged over the entire surface of the flexible board 26. In the present embodiment, the conductive path 29 that is located at the rear side in the flexible board 26 is the shielding layer 30. The shielding layer 30 electromagnetically shields a rear side of the photoelectric conversion element 27. The conductive path 29 that is located at the front side in the flexible board 26 may be the shielding layer 30.

(Photoelectric Conversion Circuit Board 13)

Figure 8:
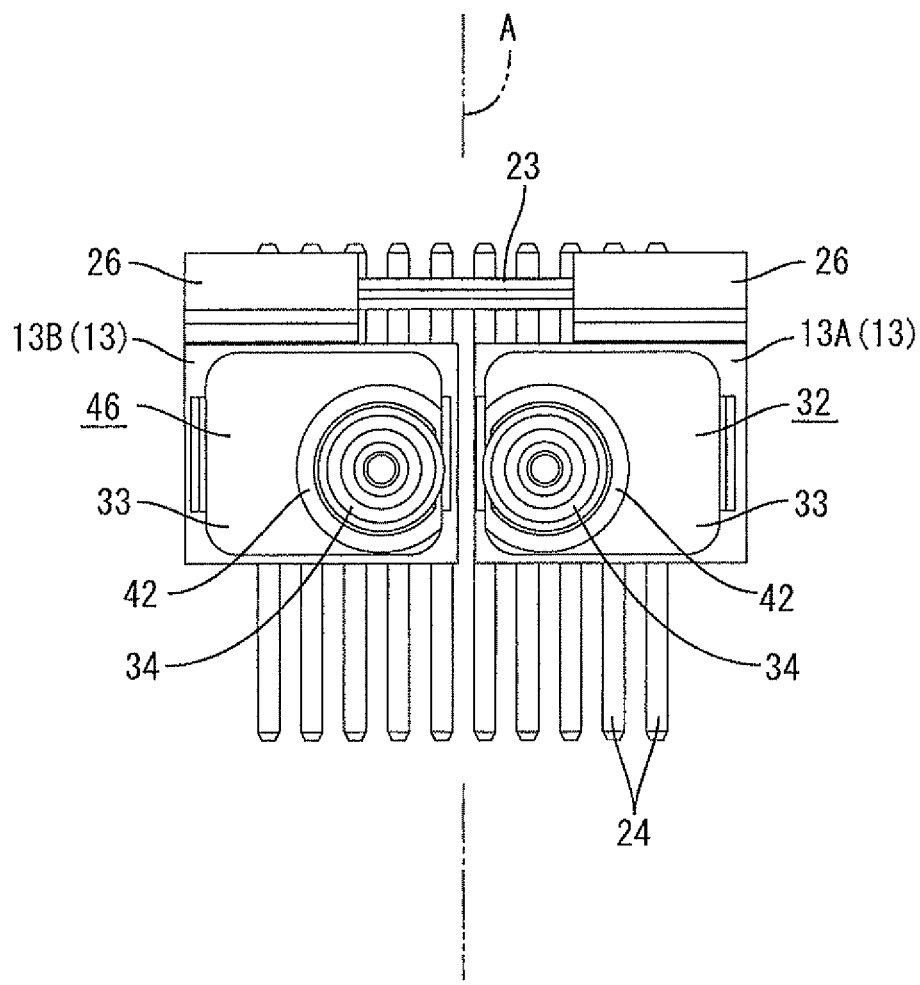
FIG. 8 is a front view of the resin member, the photoelectric conversion circuit board, and the inner board.
Figure 9:
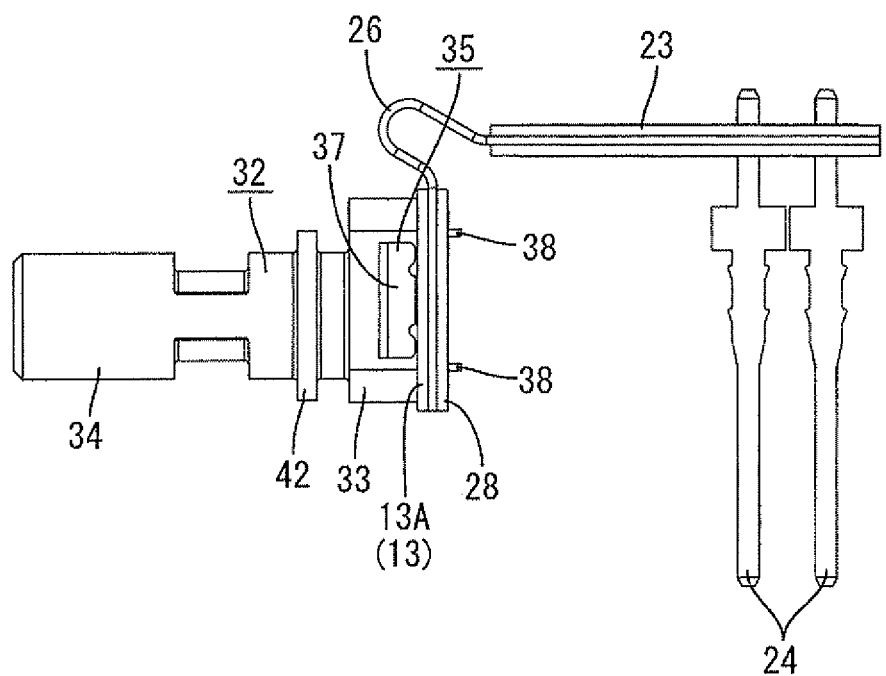
FIG. 9 is a side view of the resin member, the photoelectric conversion circuit board, and the inner board.

In the present embodiment, the photoelectric conversion element 27 includes a light receiving element 27A and a light emitting element 27B. A photodiode is used as the light receiving element 27A and VCSEL (Vertical Cavity Surface Emitting LASER) is used as the light emitting element 27B. The photoelectric conversion circuit board 13 includes a light receiving circuit board 13A including the light receiving element 27A on its surface and a light emitting circuit board 13B including the light emitting element 27B on its surface. The light receiving circuit board 13A and the light emitting circuit board 13B are separate boards. As illustrated in FIG. 8, in the present embodiment, the light receiving circuit board 13A is arranged at the right side and the light emitting circuit board 13B is arranged at the left side in FIG. 8. Since the light emitting element 27B in the present embodiment is VCSEL, the optical output from the light emitting element 27B is emitted in a direction intersecting with a plate surface of the light emitting circuit board 13B.

(Light Receiving Circuit Board 13A)

Figure 15:
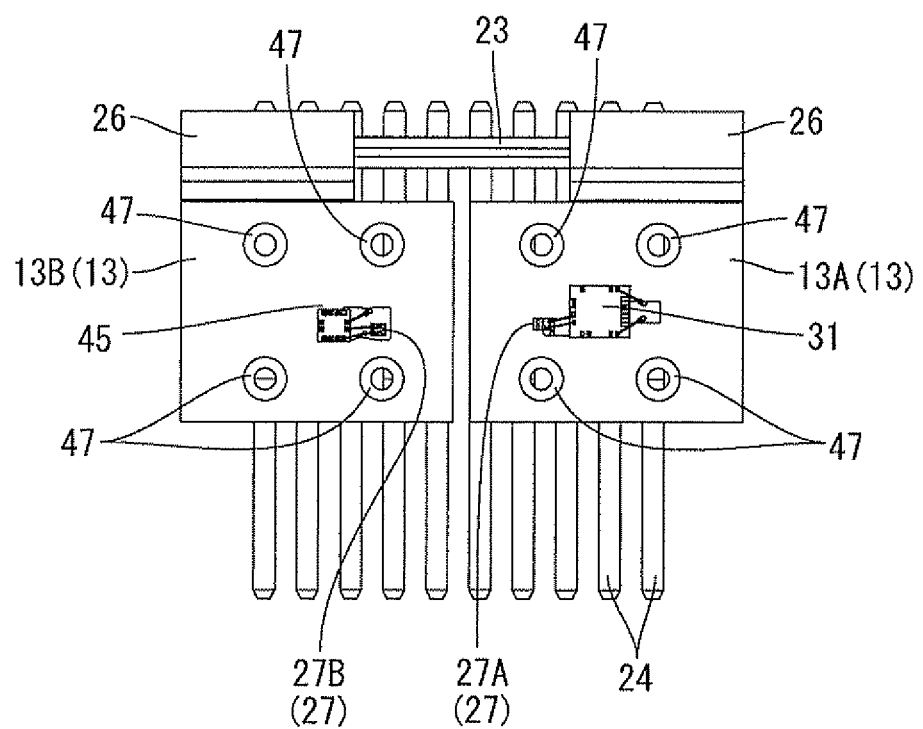
FIG. 15 is a front view of a light receiving circuit board and a light emitting circuit board.

As illustrated in FIG. 15, on a front surface of the light receiving circuit board 13A, the light receiving element 27A and a transimpedance amplifier 31 electrically connected to the light receiving element 27A are mounted. Further, on a front plate surface of the light receiving circuit board 13A, a light receiving resin member 32 (an example of the resin member) made of light transmissive synthetic resin (for example, PEI, PC, or PMMA,) is attached to cover the light receiving element 27A.

Figure 10:
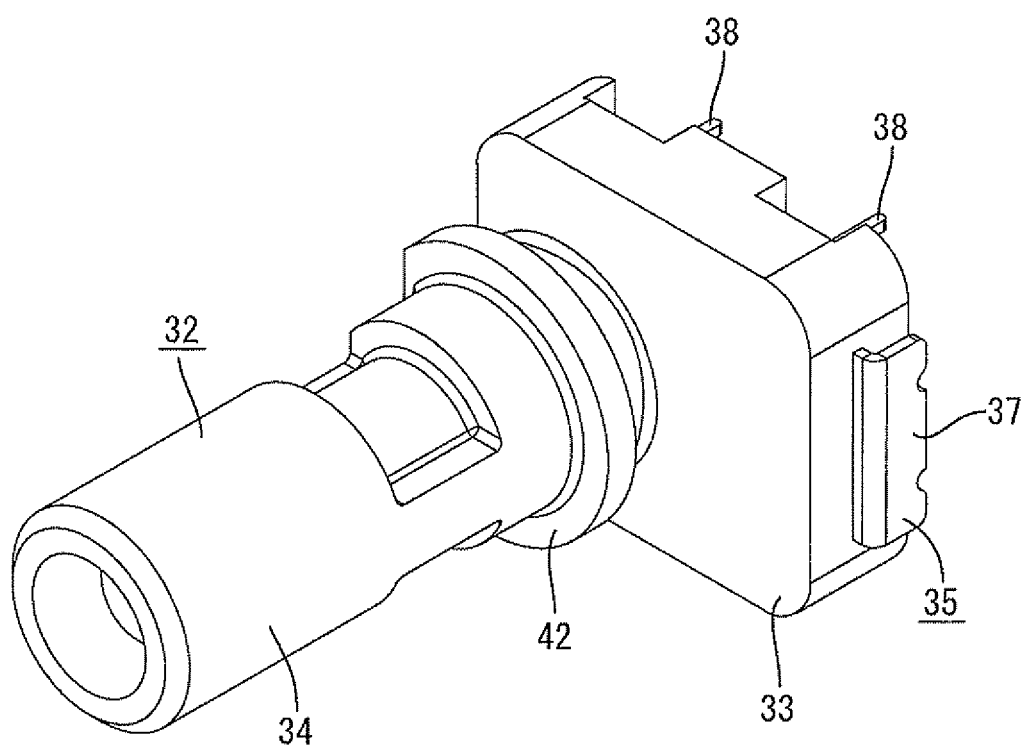
FIG. 10 is a perspective view of a light receiving resin member.

As illustrated in FIG. 10, the light receiving resin member 32 includes a base 33 and a sleeve 34. The base 33 is attached to the light receiving circuit board 13A. The sleeve 34 has a cylindrical shape and protrudes frontward from the base 33. The base 33 has a cuboidal shape and provided so as to protrude radially outwardly of the sleeve 34. As illustrated in FIG. 6, the surface of the base 33 that faces the light receiving circuit board 13A is depressed to have a space in which an inner shield 35 is arranged. The inner shield 35 is obtained by pressing a metal plate into a predetermined shape. In the present embodiment, the light receiving resin member 32 is obtained by insert molding in which the inner shield 35 is integrated with synthetic resin.

Figure 13:
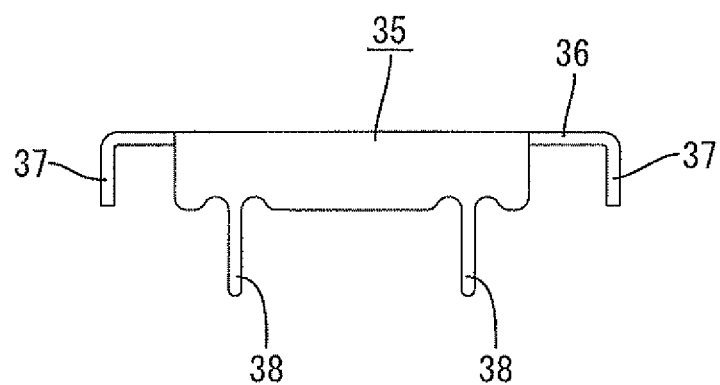
FIG. 13 is a side view of the inner shield.
Figure 14:
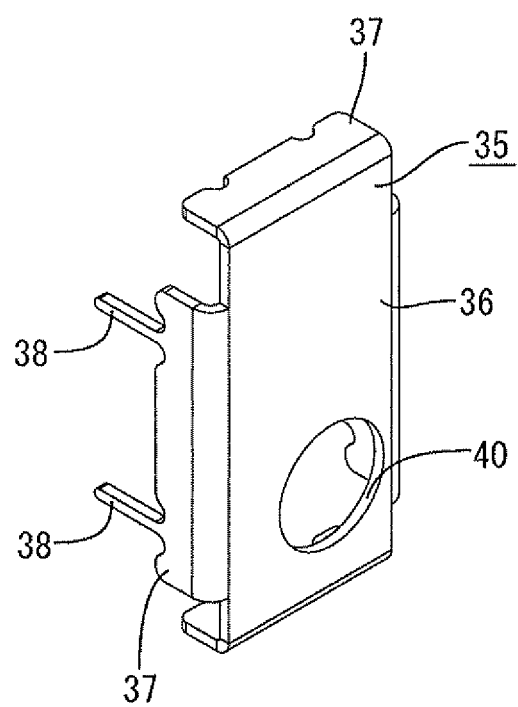
FIG. 14 is a perspective view of the inner shield.

As illustrated in FIG. 13, the inner shield 35 includes a top plate 36 and side plates 37 extending from side edges of the top plate 36 toward the light receiving circuit board 13A. The side plates 37 are in contact with a front surface of the light receiving circuit board 14A from the front side at edges on the light receiving board 13A side (see FIG. 9). Further, board connection portions 38 extend from edges of the side plates 37 on the light receiving board 13A side. The board connection portions 38 are passed through the light receiving circuit board 13A and connected to the electrically conductive path 47 formed on the light receiving circuit board 13A (see FIG. 6). The inner shield 35 electromagnetically shields the front surface of the light receiving element 27A. In the present embodiment, the inner shield 35 also shields the front surface of the transimpedance amplifier 31.

As illustrated in FIG. 4, the sleeve 34 included in the light receiving resin member 32 is arranged to extend frontward. In other words, the sleeve 34 is arranged such that an axial direction thereof extends in a front direction. The ferrule 19 attached to the end of the optical fiber 18 is fitted into the sleeve 34 from the front side (from the direction indicated by an arrow in FIG. 4). The light receiving circuit board 13A is housed in the housing 12 such that a plate surface thereof is arranged substantially perpendicular to an axial direction of the sleeve 34. In other words, the axial direction of the sleeve 34 is substantially perpendicular to the plate surface of the light receiving circuit board 13A. The wording "substantially perpendicular" implies not only the axial direction of the sleeve 34 that is perpendicular to the plate surface of the circuit board 13, but also the axial direction of the sleeve 34 that is not perpendicular to the plate surface of the circuit board 13 but substantially perpendicular to the plate surface. The plate surface of the outer board 11 is arranged along the axial direction of the sleeve 34.

As illustrated in FIG. 6, the light receiving resin member 32 integrally includes a lens 39 on the axial line of the sleeve 34 such that the lens 39 faces the light receiving element 27A. The lens 39 protrudes from a surface of the light receiving resin member 32 that faces the light receiving element 27A toward the light receiving element 27A. The lens 39 is configured to focus the optical output from the optical fiber 18 on the light receiving element 27A. The light receiving element 27A may be positioned on the axial line of the sleeve 34 or may be positioned away from the axial line of the sleeve 34 as long as the light receiving element 27A faces the lens 39.

The inner shied 35 includes a window 40 at a position corresponding to an optical path extending between the lens 39 and the light receiving element 27A. The window 40 has a circular shape in the present embodiment (see FIG. 14). The sleeve 34 includes a hole with a closed bottom at a bottom portion of the sleeve 34. The hole has a diameter smaller than an outer diameter of the ferrule 19, which prevents a contact of an end of the optical fiber 18. The hole is referred to as a relief hole 41.

Figure 11:
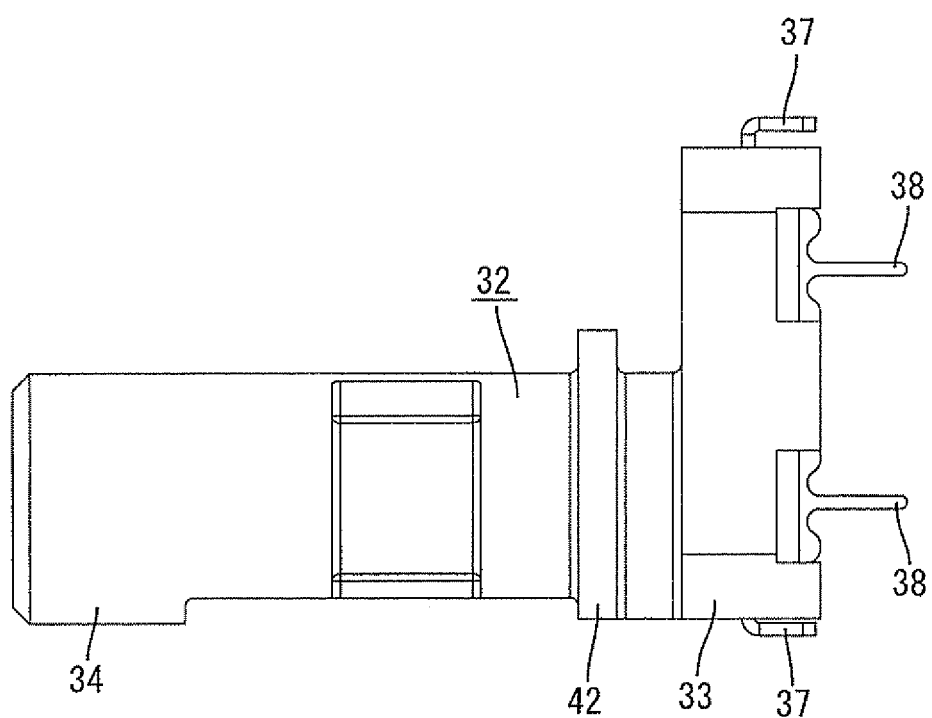
FIG. 11 is a side view of the light receiving resin member.
Figure 12:
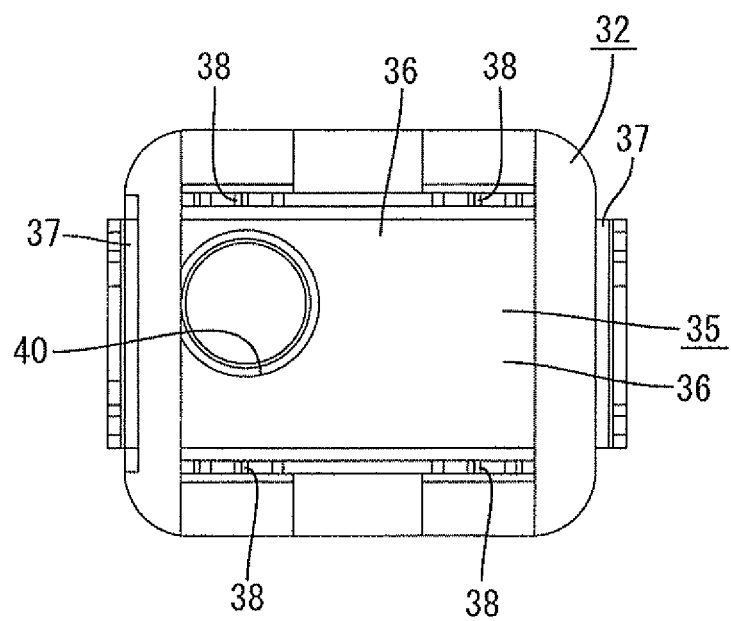
FIG. 12 is a rear view of the light receiving resin member.
Figure 16:
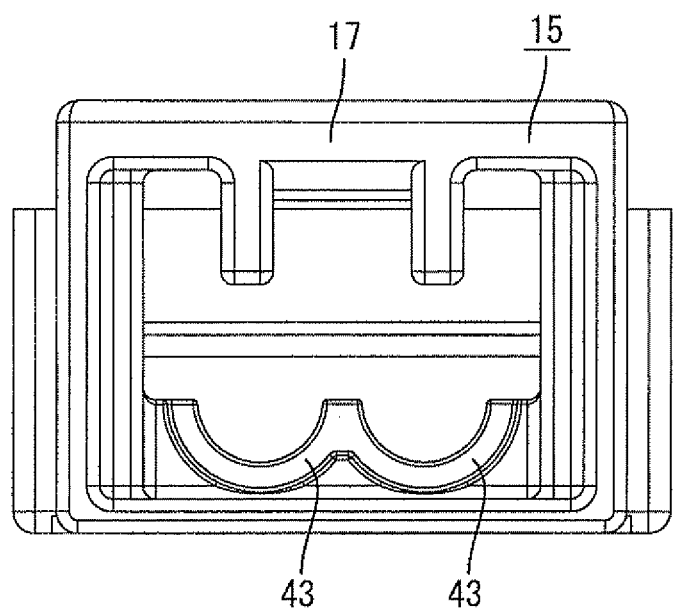
FIG. 16 is a front view of the housing body.
Figure 17:
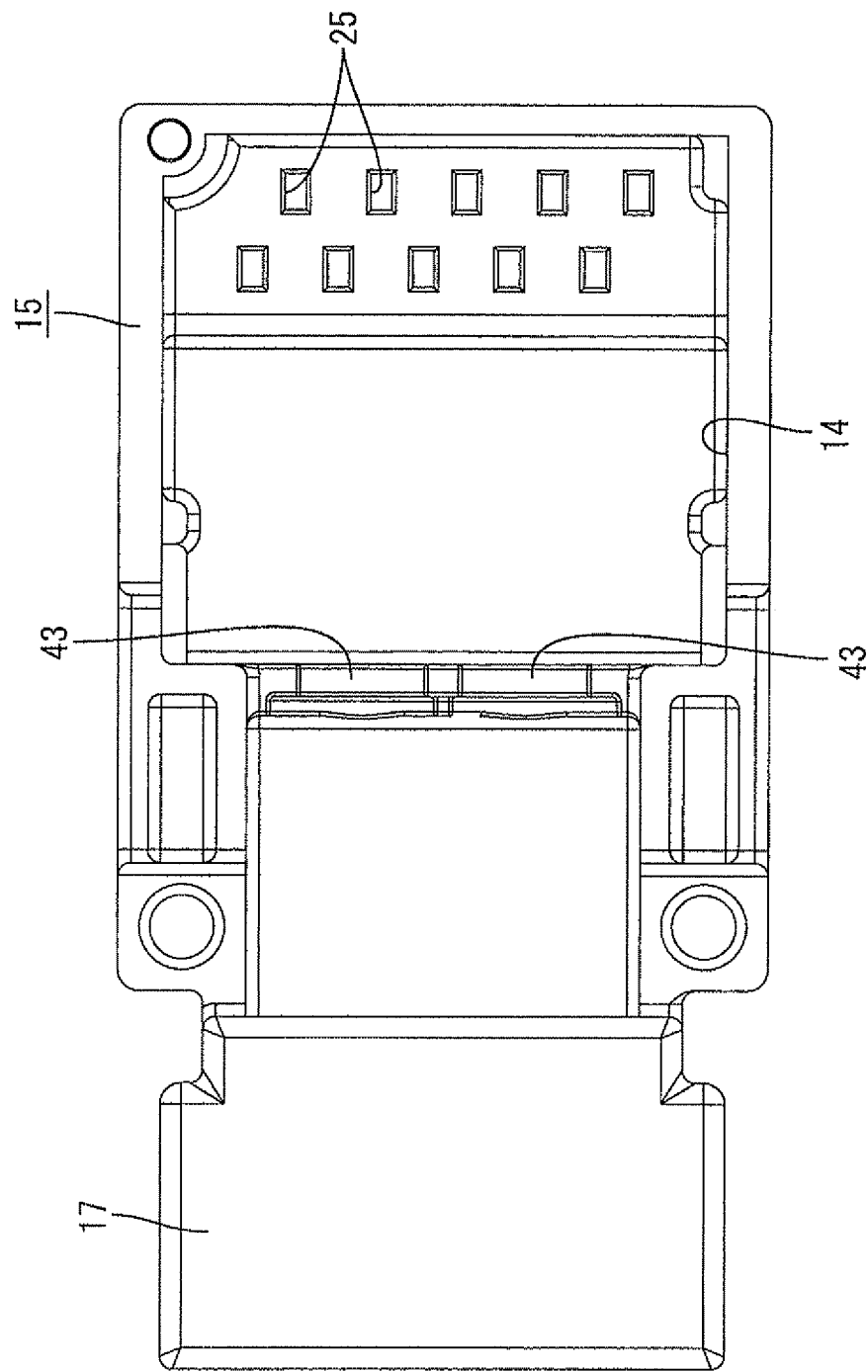
FIG. 17 is a plan view of the housing body.
Figure 18:
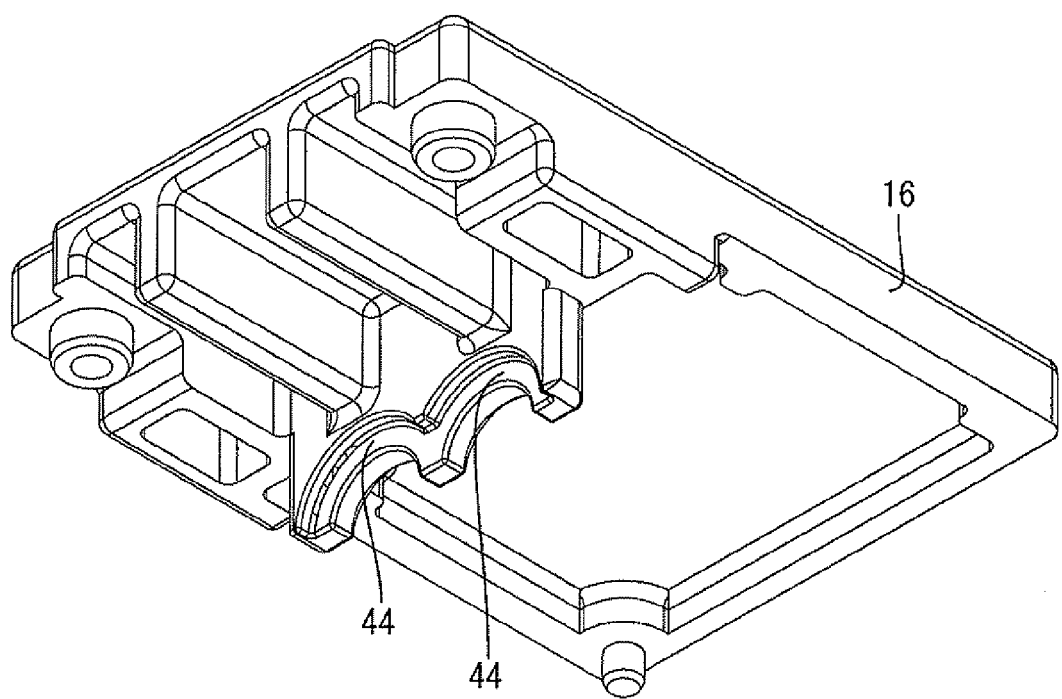
FIG. 18 is a perspective view of a cap.
Figure 19:
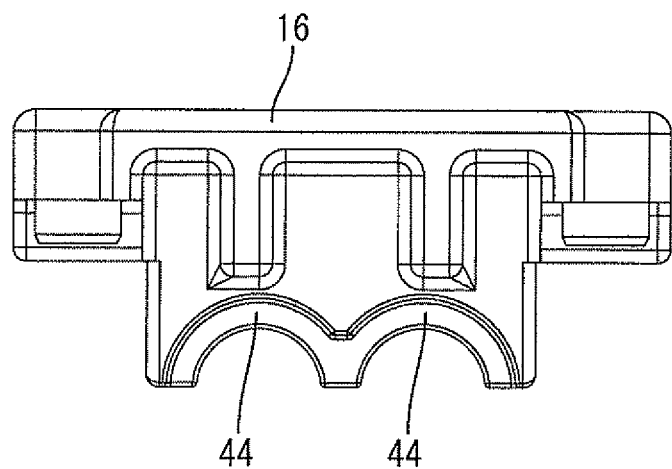
FIG. 19 is a front view of the cap.

As illustrated in FIG. 11, on an outer surface of the sleeve 34, an engagement rib 42 is provided to protrude radially outwardly of the sleeve 34. As illustrated in FIG. 16 and FIG. 17, first sleeve holding ribs 43 are provided to protrude upwardly from the bottom wall of the housing body 15 at positions each corresponding to the engagement rib 42. An upper surface of each first sleeve holding rib 43 has a semicircular shape so as to be in contact with the outer surface of the sleeve 34. Further, as illustrated in FIG. 18 and FIG. 19, second sleeve holding ribs 44 are provided to protrude downwardly from the inner surface of the cap 16 at positions each corresponding to the engagement rib 42 and the first sleeve holding rib 43. A lower surface of the second sleeve holding rib 44 has a semicircular shape so as to be in contact with the outer surface of the sleeve 34.

As illustrated in FIG. 5, when the cap 16 is attached to the housing body 15 while the light receiving resin member 32 is housed in the housing body 15 at a proper position, the first sleeve holding rib 43 and the second sleeve holding rib 44 are positioned between the engagement rib 42 provided on the light receiving resin member 32 and the base 33. The upper surface of the first sleeve holding rib 43 and the lower surface of the second sleeve holding rib 44 define a space that has a circular shape in cross section. The circular shape corresponds to the outer surface of the tubular sleeve 34 of the light receiving resin member 32. The upper surface of the first sleeve holding rib 43 and the lower surface of the second sleeve holding rib 44 are in contact with the outer surface of the sleeve 34 included in the light receiving resin member 32.

The first sleeve holding rib 43 and the second sleeve holding rib 44 are each configured to be in contact with the engagement rib 42 included in the sleeve 34 and the base 33 in the axial direction of the sleeve 34 when a force is applied to the light receiving resin member 32 in the axial direction of the sleeve 34. In the present embodiment, the engagement rib 42 included in the sleeve 34 and the base 33 are examples of the engagement portion, and the first sleeve holding rib 43 and the second sleeve holding rib 44 are examples of the engagement portion receiving portion.

(Light Emitting Circuit Board 13B)

As illustrated in FIG. 15, on a front surface of the light emitting circuit board 13B, the light emitting element 27B and a driver 45 electrically connected to the light emitting element 27B are mounted. Further, on a front surface of the light emitting circuit board 13B, a light emitting resin member 46 (an example of the resin member) made of a light transmissive synthetic resin (for example, PEI, PC, or PMMA) is attached to cover the light emitting element 27B.

As illustrated in FIG. 2, the light emitting resin member 46 includes a base 33 and a sleeve 34. The base 33 is attached to the light emitting circuit board 13B. The sleeve 34 has a cylindrical shape and protrudes frontward from the base 33. The base 33 has a cuboidal shape and is provided so as to protrude radially outwardly of the sleeve 34. The surface of the base 33 that faces the light receiving circuit board 13B is depressed to have a space in which the inner shield 35 is arranged. The inner shield 35 is obtained by pressing a metal plate into a predetermined shape. In the present embodiment, the light emitting resin member 46 is obtained by insert molding in which the inner shield 35 is integrated with synthetic resin.

In the present embodiment, the inner shield 35 provided in the light emitting resin member 46 electromagnetically shields the front surfaces of the light emitting element 27B and the driver 45. The inner shield 35 may be configured to electromagnetically shield the light emitting element 27B alone.

The sleeve 34 included in the light emitting resin member 46 is arranged to extend frontward. In other words, the sleeve 34 is arranged such that an axial direction thereof extends in a front direction. The ferrule 19 attached to the end of the optical fiber 18 is fitted into the sleeve 34 from the front side. The light emitting circuit board 13B is housed in the housing 12 such that a plate surface thereof is arranged substantially perpendicular to an axial direction of the sleeve 34. In other words, the axial direction of the sleeve 34 is substantially perpendicular to the plate surface of the light emitting circuit board 13B. The plate surface of the outer board 11 is arranged along the axial direction of the sleeve 34.

The light emitting resin member 46 integrally includes a lens 39 on the axial line of the sleeve 34 such that the lens 39 faces the light emitting element 27B. The lens 39 protrudes from a surface of the light emitting resin member 46 that faces the light emitting element 27B toward the light emitting element 27B. The lens 39 is configured to focus the optical output from the optical fiber 18 on the light emitting element 27B. The light emitting element 27B may be positioned on the axial line of the sleeve 34 or may be positioned away from the axial line of the sleeve 34 as long as the light emitting element 27B faces the lens 39.

On an outer surface of the sleeve 34, an engagement rib 42 is provided to protrude radially outwardly of the sleeve 34. First sleeve holding ribs 43 are provided to protrude upwardly from the bottom wall of the housing body 15 at positions each corresponding to the engagement rib 42. An upper surface of each first sleeve holding rib 43 has a semicircular shape so as to be in contact with the outer surface of the sleeve 34. Further, second sleeve holding ribs 44 are provided to protrude downwardly from the inner surface of the cap 16 at positions each corresponding to the engagement rib 42 and the first sleeve holding rib 43. A lower surface of the second sleeve holding rib 44 has a semicircular shape so as to be in contact with the outer surface of the sleeve 34.

When the cap 16 is attached to the housing body 15 while the light emitting resin member 46 is housed in the housing body 15 at a proper position, the first sleeve holding rib 43 and the second sleeve holding rib 44 are positioned between the engagement rib 42 provided on the light emitting resin member 46 and the base 33. The upper surface of the first sleeve holding rib 43 and the lower surface of the second sleeve holding rib 44 define a space that has a circular shape in cross section. The circular shape corresponds to the outer surface of the tubular sleeve 34 of the light receiving resin member 32. The upper surface of the first sleeve holding rib 43 and the lower surface of the second sleeve holding rib 44 are in contact with the outer surface of the sleeve 34 included in the light emitting resin member 46.

The first sleeve holding rib 43 and the second sleeve holding rib 44 are each configured to be in contact with the engagement rib 42 included in the sleeve 34 and the base 33 in the axial direction of the sleeve 34 when a force is applied to the light emitting resin member 46 in the axial direction of the sleeve 34. In the present embodiment, the engagement rib 42 included in the sleeve 34 and the base 33 are examples of the engagement portion, and the first sleeve holding rib 43 and the second sleeve holding rib 44 are examples of the engagement portion receiving portion.

The light emitting resin member 46 has substantially the same configuration as the light receiving resin member 32. The light emitting resin member 46 and the light receiving resin member 32 are arranged substantially bilateral symmetric with respect to the imaginary symmetric axis A in FIG. 8. Accordingly, parts of the light emitting resin member 46 same as parts of the light receiving resin member 32 are designated with the same number as the light receiving resin member 32 and will not be explained.

(Arrangement Between the Photoelectric Conversion Circuit Board 12 and the Inner Board 23)

As illustrated in FIG. 4, the above-described inner board 23 is housed in the housing 12 at the rear side of the photoelectric conversion circuit board 13 (the light receiving circuit board 13A and the light emitting circuit board 13B). In other words, in the housing 12, the inner board 23 is arranged at a side opposite to the resin member (the light receiving resin member 32 and the light emitting resin member 46) with respect to the photoelectric conversion circuit board 13 (the light receiving circuit board 13A and the light emitting circuit board 13B). The inner board 23 is arranged in the housing 12 so as to be oriented substantially perpendicular to the plate surface of the light receiving circuit board 13A and the plate surface of the light emitting circuit board 13B. In the present embodiment, the plate surface of the inner board 23 is oriented substantially perpendicular to the plate surface of the light receiving circuit board 13A and the plate surface of the light emitting circuit board 13B. Further, the plate surface of the inner board 23 is arranged substantially parallel to the plate surface of the outer board 11.

(Production Process)

Next, an example of the production process of the optical connector 10 according to the present embodiment will be described. Initially, the light receiving resin member 32 and the light emitting resin member 46 are each produced by insert molding in which the inner shield 35 is integrated with the synthetic resin. The inner shield 35 has a predetermined shape by press working.

The light receiving element 27A and the like are mounted on the light receiving circuit board 13A by a reflow soldering, for example, and the light emitting element 27B and the like are mounted on the light emitting circuit board 13B by a reflow soldering, for example.

Subsequently, the optical axis between the light receiving element 27A mounted on the light receiving circuit board 13A and the light receiving resin member 32 is adjusted, and then the light receiving resin member 32 is attached to the plate surface of the light receiving circuit board 13A. More specifically described, the board connection portions 38 of the inner shield 35 in the light receiving resin member 32 are connected to the conductive paths 47 of the light receiving circuit board 13A by a flow soldering. In addition, the optical axis between the light emitting element 27B mounted on the light emitting circuit board 13B and the light emitting resin member 46 is adjusted, and then the light emitting resin member 46 is attached to the plate surface of the light emitting circuit board 13B. More specifically described, the board connection portions 38 of the inner shield 35 in the light emitting resin member 46 are connected to the conductive paths 47 of the light emitting circuit board 13B by a flow soldering.

Thereafter, the inner board 23 connected to the light receiving circuit board 13A and the light emitting circuit board 13B via the flexible board 26 is connected to one end portion of each terminal connector 24 by a flow soldering.

Then, as illustrated in FIG. 20, the light receiving circuit board 13A, the light emitting circuit board 13B, and the inner board 23 are housed in the opening 14 of the housing body 15. At this time, the other end portion of each terminal connector 24 connected to the inner board 23 is press fitted into the respective terminal insertion holes 25 of the housing body 15. Further, the sleeves 34 of the light receiving resin member 32 and the light emitting resin member 46 are arranged on the upper surface of the first sleeve holding rib 43.

Next, the cap 16 is attached to the housing body 15. The sleeves 34 of the light receiving resin member 32 and the light emitting resin member 46 are sandwiched between the first sleeve holding ribs 43 and the second sleeve holding ribs 44. The first sleeve holding ribs 43 and the second sleeve holding ribs 44 are positioned between the engagement ribs 42 and the bases 33.

The outer shield 20 having a predetermined shape by press working is fitted onto the housing 12. The locking tabs 21 are bent toward the lower surface of the housing 12 to fit the outer shield 20 and the housing 12 together. Thus, the optical connector 10 is obtained. The optical connector 10 is connected to the outer board 11 by connecting the connection legs 22 thereof to the outer board 11 by a flow soldering.

(Effects and Advantages)

Next, effects and advantages to be obtained by the present embodiment will be explained. According to the present embodiment, the optical output from the optical fiber 18 fitted in the sleeve 34 travels inside the light receiving resin member 32 along the axial direction of the sleeve 34. Then, the optical output is focused and outputted by the lens 39. The optical output outputted from the lens 39 is applied to the photoelectric conversion element 27 that is arranged to face the lens 39.

On the other hand, the optical output from the photoelectric conversion element 27 travels to the lens 39 that is arranged to face the photoelectric conversion element 27 and is focused by the lens 39. The focused optical output travels inside the light emitting resin member 46 along the axial direction of the sleeve 34 to the optical fiber 18 fitted in the sleeve 34.

As described above, according to the present embodiment, the length of the optical path in the light receiving resin member 32 and the light emitting resin member 46 can be shorter, because the light travels along the axial line the sleeve 34 in the light receiving resin member 32 and the light emitting resin member 46. Accordingly, the optical output passing through the light receiving resin member 32 and the light emitting resin member 46 is less likely to be reduced even if a force is applied to the optical fiber in the direction perpendicular to the axial line of the optical fiber 18.

Further, according to the present embodiment, the photoelectric conversion circuit board 13 is arranged substantially perpendicular to the axial direction of the sleeve 34. The outer board 11 is arranged along the axial direction of the sleeve 34. Thus, the photoelectric conversion circuit board 13 is oriented substantially perpendicular to the plate surface of the outer board 11. If the number of circuits on the photoelectric conversion circuit board 13 increases, the size of the photoelectric conversion circuit board 13 increases. This may increase the size of the optical connector 10 in the direction perpendicular to the plate surface of the outer board 11. In the above embodiment, the inner board 23 electrically connected to the photoelectric conversion circuit board 13 is arranged so as to be oriented substantially perpendicular to the plate surface of the photoelectric conversion circuit board 13. With this configuration, compared to the case in which all of the circuits are provided on the photoelectric conversion circuit board 13, the optical connector 10 can have a smaller size in the direction perpendicular to the plate surface of the outer board 11.

The photoelectric conversion circuit board 13 is required to be positioned with respect to the optical axis of the optical fiber 18. The inner board 23 is required to be positioned with respect to the outer board via the terminal connector 24. In this way, the photoelectric conversion circuit board 13 and the inner board 23 are required to be positioned with respect to different members. In view of the above, the present embodiment employs the flexible board 26 to electrically connect the photoelectric conversion circuit board 13 and the inner board 23. With this configuration, the photoelectric conversion circuit board 13 and the inner board 23 can be moved relative to each other. Thus, even when the photoelectric conversion circuit board 13 is positioned with respect to the optical axis of the optical fiber 18 and the inner board 23 is positioned with respect to the outer board 11, a stress is less likely to be applied to the photoelectric conversion circuit board 13 and the inner board 23 through the flexible board 26.

Further, according to the present embodiment, the flexible board 26 is arranged to cover the entire surface of the photoelectric conversion circuit board 13 on which the photoelectric conversion element 27 is mounted. The flexible board 26 includes the shielding layer 30 arranged over the entire surface of the flexible board 26. In this configuration, a surface of the photoelectric conversion circuit board 13 that is opposite to the surface on which the photoelectric conversion element 27 is mounted is shielded by the shielding layer 30 of the flexible board 26.

If a force is applied to the optical connector 10 in the axial direction of the optical connector 10, the force is transmitted to the sleeve 34 attached to the optical connector 10. The sleeve 34 may be moved in the axial direction thereof by the force. In such a case, a force may be applied to a connection portion between the sleeve 34 and the photoelectric conversion circuit board 13. According to the present embodiment, if the force is applied to the sleeve 34 in the axial direction thereof, the engagement rib 42 formed on the sleeve 34 and the base 33 come into contact with the first sleeve holding rib 43 and the second sleeve holding rib 44 of the housing 12 in the axial direction of the sleeve 34. This limits the movement of the sleeve 34 in the axial direction thereof. Accordingly, even if a force is applied to the optical connector 10 in the axial direction of the optical connector 10, the force is less likely to be applied to the connection portion between the sleeve 34 and the photoelectric conversion circuit board 13.

Further, according to the present embodiment, the movement of the sleeve 34 in the direction intersecting with the axial line of the sleeve 34 is limited, because the sleeve 34 is sandwiched between the first sleeve holding rib 43 and the second sleeve holding rib 44 in the direction intersecting with the axial line of the sleeve 34. With this configuration, even if a force is applied to the sleeve 34 in the direction intersecting with the axial direction of the sleeve 34, the sleeve 34 is less likely to be moved in the axial direction thereof.

According to the present embodiment, the light receiving resin member 32 and the light emitting resin member 46 each include the inner shield 35 made of metal so as to face the photoelectric conversion circuit board 13. The inner shield 35 is arranged to cover the photoelectric conversion element 27. Further, the inner shield 35 includes the window 40 at the position corresponding to the optical path extending between the lens 39 and the photoelectric conversion element 27. With this configuration, a surface of the photoelectric conversion element 27 that faces the light receiving resin member 32 or the light emitting resin member 46 can be shielded by the inner shield 35. In addition, the light hardly reaches the photoelectric conversion element 27 due to the inner shield 35 covering the photoelectric conversion element 27. Accordingly, the light applied to the outer surface of the light receiving resin member 32 and the light emitting resin member 46 is less likely to reach the photoelectric conversion element 27.

According to the present embodiment, on the light receiving circuit board 13A, the light receiving element 27A is mounted and the light receiving resin member 32 is attached. On the light emitting circuit board 13B, which is a separate member from the light receiving circuit board 13A, the light emitting element 27B is mounted and the light emitting resin member 46 is attached. With this configuration, the optical axis between the light receiving element 27A and the light receiving resin member 32 can be precisely adjusted and the optical axis between the light emitting element 27B and the light emitting resin member 46 can be precisely adjusted, because each optical axis can be separately adjusted.

In the present embodiment, the light receiving resin member 32 and the light emitting resin member 46 each integrally include the lens 39. Accordingly, compared to the case in which the light receiving resin member 32 and the lens 39 are separate members and the case in which the light emitting resin member 46 and the lens 39 are separate members, the number of components is reduced. Thus, the production cost of the optical connector 10 can be reduced.

<Other Embodiments>

The present invention is not limited to the embodiments described in the above description and explained with reference to the drawings. The following embodiments may be included in the technical scope of the present invention.

(1) In the present embodiment, the light receiving circuit board 13A, the light emitting circuit board 13B, and the inner board 23 are housed in the housing 12. However, the present invention is not limited to this configuration. One photoelectric conversion circuit board 13 on which the light receiving element 27A and the light emitting element 27B are mounted may be housed in the housing 12. Further, the terminal connector 24 may be connected to the photoelectric conversion circuit board 13 at one end portion thereof and may be connected to an outer circuit board at the other end portion thereof that is passed through the housing 12.

(2) In the present embodiment, the flexible board 26 is used as a relay member. However, the present invention is not limited to this configuration. The relay member may be obtained by bending a rod-shaped terminal connector in an L shape. The terminal connector may be connected to the photoelectric conversion circuit board 13 at one end portion thereof and may be connected to the inner board 23 at the other end portion thereof.

(3) The sleeve 34 may include an engagement portion protruding radially outwardly of the sleeve 34 from the outer surface thereof, and the housing 12 may include an engagement portion receiving portion recessed at an inner surface thereof.

(4) In the present embodiment, a surface of the photoelectric conversion circuit board 13 that is opposite to the surface on which the photoelectric conversion element 27 is mounted is shielded by the shielding layer 30 included in the flexible board 26. However, the present invention is not limited to this configuration. The photoelectric conversion element 27 may be shielded by conductive path formed by a printed wiring technology on the entire surface of the photoelectric conversion circuit board 13 that is opposite to the surface on which the photoelectric conversion element 27 is mounted. In such a case, the shielding layer 30 of the flexible board 26 may not be provided.

(5) In the present embodiment, the inner shield 35 in the light receiving resin member 32 electromagnetically shields the light receiving element 27A and the inner shield 35 in the light emitting resin member 47 electromagnetically shields the light emitting element 27B. However, the present invention is not limited to this configuration. A shielding member that collectively covers the light receiving element 27A and the light emitting element 27B may electromagnetically shield the light receiving element 27A and the light emitting element 27B.

(6) In the present embodiment, one housing 12 houses the light receiving circuit board 13A on which the light receiving element 27A is mounted and the light emitting circuit board 13B on which the light emitting element 27B is mounted. However, the present invention is not limited to this configuration. One housing 12 may only house the light receiving circuit board 13A or one housing 12 may only house the light emitting circuit board 13B.

(7) In the present embodiment, the sleeve 34 is sandwiched between the first sleeve holding rib 43 and the second sleeve holding rib 44. However, the present invention is not limited to this configuration. The housing body 15 may include a groove at its bottom wall. The sleeve 34 may be attached to the housing body 15 by fitting the sleeve 34 in the groove.

(Means for Solving the Problems)

The optical connector according to the technology disclosed herein includes a housing, a photoelectric conversion circuit board on which a photoelectric conversion element is mounted, and a resin member made of a light transmissive synthetic resin and arranged on a plate surface of the photoelectric conversion circuit board so as to cover the photoelectric conversion element. The photoelectric conversion circuit board is housed in the housing. The resin member includes a sleeve to which a ferrule attached to an end of an optical fiber is fitted. The sleeve of the resin member is arranged such that an axial direction thereof is substantially perpendicular to the plate surface of the photoelectric circuit board. The resin member integrally includes a lens on an axial line of the sleeve such that the lens faces the photoelectric conversion element.

According to the technology described herein, the optical output from the optical fiber fitted in the sleeve travels in the resin member along the axial direction of the sleeve to the lens. Then, the optical output is focused by the lens and outputted from the lens. The optical output outputted from the lens is applied to the photoelectric conversion element arranged to face the lens. On the other hand, the optical output outputted from the photoelectric conversion element reaches the lens arranged to face the photoelectric conversion element. Then, the optical output is focused by the lens and travels in the resin member along the axial direction of the sleeve to reach the optical fiber fitted in the sleeve. In this way, according to the technology described herein, the light travels in the resin member on the axial line of the sleeve, and thus the optical path length in the resin member is relatively short. Accordingly, if a force is applied to the optical fiber in the direction perpendicular to the axial line of the optical fiber, the optical output traveling in the resin member is less likely to be reduced.

The following configurations are preferable as the embodiments according to the technology described herein.

Preferably, the housing is connected to an outer board while being arranged along the axial direction of the sleeve, the housing further includes an inner board housed in the housing so as to be positioned at a side that is opposite to a side of the resin member with respect to the photoelectric conversion circuit board, the inner board being oriented substantially perpendicular to the plate surface of the photoelectric conversion circuit board, the inner board and the photoelectric conversion circuit board are electrically connected by a relay member, the inner board is connected to one end portion of a terminal connector, another end of the terminal connector is connected to the outer board thereof positioned outside the housing.

The photoelectric conversion circuit board is arranged substantially perpendicular to the axial direction of the sleeve. Further, the outer board is arranged along the axial direction of the sleeve. Accordingly, the photoelectric conversion circuit board is oriented substantially perpendicular to the plate surface of the outer board. If the number of circuits formed on the photoelectric conversion circuit board increases, the size of the photoelectric conversion circuit board increases. This may increase the size of the optical connector in the direction perpendicular to the plate surface of the outer board. In the above configuration, the inner board electrically connected to the photoelectrical conversion circuit is arranged so as to be oriented substantially perpendicular to the plate surface of the photoelectric conversion circuit board. With this configuration, the optical connector can be downsized in the direction perpendicular to the plate surface of the outer board compared to the photoelectric conversion circuit board on which all of the circuits are formed.

Preferably, the relay member is a flexible board.

The photoelectric conversion circuit board is required to be positioned with respect to the optical axis of the optical fiber. The inner board is required to be positioned with respect to the outer board via the terminal fitting. In this way, the photoelectric conversion circuit board and the inner board are required to be positioned with respect to the different members. In view of the above, in this configuration, the relay member electrically connecting the photoelectric conversion circuit board with the inner board is the flexible board. With this configuration, the photoelectric conversion circuit board and the inner board can be relatively moved with respect to each other. Accordingly, even if the photoelectric conversion circuit board is positioned with respect to the optical axis of the optical fiber and the inner board is positioned with respect to the outer board, a force is less likely to be applied to the photoelectric conversion circuit board and the inner board via the relay member.

Preferably, the flexible board is arranged to cover a surface of the photoelectric conversion circuit board opposite to a surface thereof on which the photoelectric conversion element is mounted, and the flexible board includes a shielding layer over an entire surface of the flexible board.

According to the above configuration, the surface of the photoelectric conversion circuit board opposite to the surface on which the photoelectric conversion element is mounted is electromagnetically shielded by the shielding layer of the flexible board that is arranged to cover the entire surface thereof.

Preferably, the resin member includes an engagement portion protruding or recessed from an outer surface thereof in a radial direction of the sleeve. The housing may include an engagement portion receiving portion that engages with the engagement portion. The engagement portion receiving portion may protrude or recess from an inner surface of the housing at a position corresponding to the engagement portion. The engagement portion and the engagement portion receiving portion may be configured to come in contact with each other upon an application of a force to the sleeve in the axial direction of the sleeve.

If a force is applied to the optical connector in the axial direction of the optical connector, the force is transmitted to the sleeve of the optical connector. The sleeve may be moved in the axial direction thereof by such a force. In such a case, the force may be applied to the connection portion between the sleeve and the photoelectric conversion circuit board. According to this configuration, if the force is applied to the sleeve in the axial direction of the sleeve, the engagement portion formed on the sleeve and the engagement portion receiving portion formed in the housing come in contact with each other in the axial direction of the sleeve. This limits the movement of the sleeve in the axial direction thereof. Accordingly, even if the force is applied to the optical connector in the axial direction of the optical connector, the force is less likely to be applied to the connection portion between the sleeve and the photoelectric conversion circuit board.

Preferably, the housing includes a housing body having an opening and a cap attached to the housing body to cover the opening. A first sleeve holding rib may be provided protruding from a bottom wall of the housing body to the sleeve and may be in contact with an outer surface of the sleeve. A second sleeve holding rib may be provided protruding from an inner surface of the cap to the sleeve and may be in contact with the outer surface of the sleeve. The sleeve may be sandwiched between the first sleeve holding rib and the second sleeve holding rib in a direction intersecting with the axial line of the sleeve.

In the above configuration, the sleeve is sandwiched between the first sleeve holding rib and the second sleeve holding rib in the direction intersecting with the axial line of the sleeve. Thus, the sleeve is less likely to be moved in the direction intersecting with the axial line of the sleeve. Accordingly, even if a force is applied to the sleeve in the direction intersecting with the axial direction of the sleeve, the sleeve is less likely to be moved in the axial direction of the sleeve.

Preferably, the resin member includes an inner shield made of metal and arranged in the resin member so as to face and the photoelectric conversion circuit board and cover the photoelectric conversion element. The inner shield may include a window at a position corresponding to an optical path extending between the lens and the photoelectric conversion element.

According to the above-described configuration, the surface of the photoelectric conversion element that faces the resin member is shielded by the inner shield.

Preferably, the photoelectric conversion element includes a light receiving element and a light emitting element. The photoelectric conversion circuit board may include a light receiving circuit board on which the light receiving element is mounted and a light emitting circuit board on which the light emitting element is mounted. The light receiving element and the light emitting element are separate members. The resin member may include a light receiving resin member attached to the light receiving circuit board and a light emitting resin member attached to the light emitting circuit board.

In the above configuration, on the light receiving circuit board, the light receiving element is arranged and the light receiving reins member is attached. Further, on the light emitting circuit board, which is a separate member from the light receiving circuit board, the light emitting element is arranged and the light emitting resin member is attached. With this configuration, the optical axis between the light receiving element and the light receiving resin member and the optical axis between the light emitting element and the light emitting resin member can be separately adjusted, and thus each optical axis can be precisely adjusted.

(Effect to be Obtained by the Technology Disclosed Herein)

According to the technology disclosed herein, even if a force is applied to the optical fiber in the direction perpendicular to the axial line of the optical fiber, the optical output is less likely to be reduced.

The invention claimed is:

1. An optical connector for use with an optical fiber, the optical connector comprising:
   a housing;
   a photoelectric conversion circuit board on which a photoelectric conversion element is mounted, the photoelectric conversion circuit board being housed in the housing;
   a resin member made of a light transmissive synthetic resin and arranged on a plate surface of the photoelectric conversion circuit board so as to cover the photoelectric conversion element, the resin member including a sleeve to which a ferrule attached to an end of the optical fiber is fitted;
   an inner board positioned in the housing at a side that is opposite to a side of the resin member with respect to the photoelectric conversion circuit board, the inner board being oriented substantially perpendicular to the plate surface of the photoelectric conversion circuit board;
   a flexible board electrically connecting the inner board and the photoelectric conversion circuit board; and
   a terminal connector connected to the inner board at one end portion thereof and connected to an outer board at another end portion thereof positioned outside the housing, the outer board being connected to the housing while being arranged along the axial direction of the sleeve, wherein:
   the flexible board is arranged to cover a surface of the photoelectric conversion circuit board opposite to a surface thereof on which the photoelectric conversion element is mounted,
   the flexible board includes a shielding layer over an entire surface of the flexible board,
   the sleeve of the resin member is arranged such that an axial direction thereof is substantially perpendicular to the plate surface of the photoelectric circuit board,
   the resin member integrally includes a lens on an axial line of the sleeve such that the lens faces the photoelectric conversion element, and
   the resin member further includes an inner shield, the inner shield being made of metal and being arranged to face the photoelectric conversion circuit board and cover the photoelectric conversion element, the inner shield including:
      a window at a position corresponding to an optical path extending between the lens and the photoelectric conversion element, and
      a board connection portion being connected electrically to a conductive path formed on the photoelectric conversion circuit board.

2. The optical connector according to claim 1, wherein
   the resin member includes an engagement portion protruding or recessed from an outer surface thereof in a radial direction of the sleeve,
   the housing includes an engagement portion receiving portion that engages with the engagement portion, the engagement portion receiving portion protruding or recessed from an inner surface of the housing at a position corresponding to the engagement portion, and
   the engagement portion and the engagement portion receiving portion are configured to come in contact with each other upon an application of a force to the sleeve in the axial direction of the sleeve.

3. The optical connector according to claim 1, wherein the housing includes:
   a housing body having an opening and a cap attached to the housing body to cover the opening, and
   a first sleeve holding rib and a second sleeve holding rib, the first sleeve holding rib protruding from a bottom wall of the housing body to the sleeve and being in contact with an outer surface of the sleeve, the second sleeve holding rib protruding from an inner surface of the cap to the sleeve and being in contact with the outer surface of the sleeve, whereby the sleeve is sandwiched between the first sleeve holding rib and the second sleeve holding rib in a direction intersecting with the axial line of the sleeve.

4. The optical connector according to claim 1, wherein
   the photoelectric conversion element includes a light receiving element and a light emitting element,
   the photoelectric conversion circuit board includes a light receiving circuit board on which the light receiving element is mounted and a light emitting circuit board on which the light emitting element is mounted, the light receiving element and the light emitting element being separate members, and
   the resin member includes a light receiving resin member attached to the light receiving circuit board and a light emitting resin member attached to the light emitting circuit board.

* * * * *